United States Patent
Yang et al.

(10) Patent No.: US 7,476,893 B2
(45) Date of Patent: Jan. 13, 2009

(54) VERTICAL ORGANIC FIELD EFFECT TRANSISTOR

(75) Inventors: Yang Yang, Los Angeles, CA (US); Liping Ma, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/569,755

(22) PCT Filed: Aug. 24, 2004

(86) PCT No.: PCT/US2004/027579

§ 371 (c)(1), (2), (4) Date: Feb. 24, 2006

(87) PCT Pub. No.: WO2005/024907

PCT Pub. Date: Mar. 17, 2005

(65) Prior Publication Data

US 2006/0284230 A1     Dec. 21, 2006

Related U.S. Application Data

(60) Provisional application No. 60/546,480, filed on Feb. 19, 2004, provisional application No. 60/498,925, filed on Aug. 29, 2003.

(51) Int. Cl.
*H01L 51/10* (2006.01)

(52) U.S. Cl. .......................... 257/40; 257/60; 257/329; 257/E51.006; 257/E25.008; 257/E27.117

(58) Field of Classification Search ................... 257/40, 257/60, 329, E25.008, E27.117, E51.006
See application file for complete search history.

(56) References Cited

U.S. PATENT DOCUMENTS

| 6,465,834 | B1 | 10/2002 | Nakazato et al. |
| 2002/0171125 | A1 | 11/2002 | Bao et al. |
| 2004/0029310 | A1 | 2/2004 | Bernds et al. |
| 2006/0105492 | A1* | 5/2006 | Veres et al. ............... 438/99 |

FOREIGN PATENT DOCUMENTS

| DE | 100 57 665 A1 | 6/2002 |
| JP | 2004-6476 | 1/2004 |

(Continued)

OTHER PUBLICATIONS

F. Ebisawa, T. Kurokawa, and, S. Nara, J. Appl. Phys.:-54, 3255(1983).

(Continued)

*Primary Examiner*—Marcos D. Pizarro
(74) *Attorney, Agent, or Firm*—Venable LLP; Henry J. Daley (57) ABSTRACT

A vertical organic field effect transistor that includes an active cell and a capacitor that share a common source electrode. The active cell includes a semiconductor layer that is sandwiched between a drain electrode and the common source electrode. The capacitor includes a dielectric layer that is sandwiched between a gate electrode and the common source electrode. The common source electrode allows control of electrical current between the source and drain electrodes by controlling the electrical potential that is applied to the gate electrode.

8 Claims, 12 Drawing Sheets

FOREIGN PATENT DOCUMENTS

JP          2004-128028 A          4/2004

OTHER PUBLICATIONS

A. Tsumura, H. Koezuka, and T. Ando, Appl. Phys. Lett. 49, 1210(1986).

G. Horowitz, Adv. Mater. 10, 365(1998).

C.D. Dimitrakopoulos and P.R.L. Malenfant, Adv. Mater. 14, 99(2002).

G. Wang, Y. Luo, and P.H. Beton, Appl. Phys. Lett. 83, 3108(2003).

C.D. Dimitrakopoulos, S. Purushothaman, J. Kyinissis, -A. Callegari, and J.M. Shaw, Science, 283, 822(1999).

N. Stutzmann, R.F. Friend, H. Sirringhaus, Science, 299, 1881(2003).

R. Parashkov, E. Becker, S. Hartmann, G. Ginev, D. Schneider, H. Krautwald, T. Dobbertin, D. Metzdorf, F. Brunetti, Schildknecht, A. Kammoun, M. Brandes, T. Riedl, H. Johannes, and W. Kowalsky, Appl. Phys. Lett. 82, 4579(2003).

P. Ostoja, S. Guerri, S. Rossini, M. Servidori, C. Taliani, R. Zamboni, Synth. Met. 54,447(1993).

A. Dodabalapur, L. Torsi, H.E. Katz, Science 268, 270(1995).

A. Dodabalapur, Z. Bao, A. Makhija, J.G. Laquindanum, V.R. Raju, Y. Feng, H.E. Katz, and J. Rogers, Appl. Phys. Lett. 73, 142(1998).

Conway BE, J. Electrochemical Society 138, 1539(1991).

An KH, Kim WS, Park YS, Moon JM, Bae DJ, Lim SC, Lee YS, Lee YH, Adv. Functional Mater. 11, 387(2001).

P. Lunkenheimer, V. Bobnar, A.V. Pronin, A.I. Ritus, A.A. Volkov, and A. Loidl, Phys. Rev. B 66, 52105(2002).

G. Wang, J. Swensen, D. Moses, and A.J. Heeger, J. Appl., Phys. 93, 6137(2003).

Sirringhaus, H. et al: "Integrated Optoelectronic Devices Based on Conjugated Polymers," Science, American Association for the Advancement of Science, US, vol. 280, Jun. 12, 1998, pp. 1741-1744.

Scheon, J. H. et al: "Self-Assembled Monolayer Organic Field-Effect Transistors" Nature, Nature Publishing Group, London, GB, vol. 413, No. 6857, Oct. 18, 2001, pp. 713-716.

* cited by examiner

(a) C$_{60}$　　　(b) Pentacene　　　(c) AlQ$_3$

(d) CuPc　　　(d) m-TDATA

(e) CN-PPV

*Poly[2-Methoxy-5-(2'-ethylhexyloxy)-1,4-(1-cyanovinylene)phenylene]*

VERTICAL ORGANIC FIELD EFFECT TRANSISTOR

This application is a National Stage of PCT/US2004/027579 filed Aug. 24, 2004, which claims the benefit under 35 U.S.C. 119(e) to Application No. 60/498,925, filed Aug. 29, 2003 and Application No. 60/546,480 filed Feb. 19, 2004, the entire contents of which are incorporated herein by reference.

BACKGROUND OF THE INVENTION

1. Field of the Invention

The present invention relates generally to semiconductor devices that include an organic field effect transistor (OFET). More particularly, the present invention relates to organic semiconductor devices that utilize vertical device architecture to form a vertical organic field effect transistor (VOT).

2. Description of Related Art

The publications and other reference materials referred to herein to describe the background of the invention and to provide additional detail regarding its practice are hereby incorporated by reference. For convenience, the reference materials are numerically referenced and grouped in the appended bibliography.

Organic field effect transistors (OFETs) have attracted considerable attention since their discovery [1,2] due to their flexibility, their low cost, and their amenability to fabrication over large surface areas. They have been extensively investigated [3,4]. However, the performance of OFETs remains poor compared to their inorganic counterparts. The reduced performance of the OFETS with regards their much lower current output (on the order of μA) and higher working voltages (up to 100 V), is due to the much lower carrier mobility for organic materials compared to the carrier mobility of materials found in inorganic FETs [4,5]. Several approaches have been used for improving the performance of these devices.

In order to circumvent the low carrier mobility problem, decreasing the channel length and increasing the dielectric constant of the gate insulators of the OFETs were approaches tried by several research groups. Dimitrakopoulos, et al, reported low working voltage OFETs using high dielectric constant metal oxide as the gate insulator; however, the source-drain current was still low [6]. The method for decreasing the channel length of OFETs was to employ a vertical structure for device fabrication. Several groups utilized and reported this approach [7,8]. In the vertically structured transistor the gate electrode was located between and perpendicular to the source and the drain electrodes. The cross sectional area for the source-drain current of these vertical transistors was determined by the channel width (which was in the micrometer range) multiplied by the channel thickness (which was several monolayers) [9,10]. This cross sectional area was the same as that found for non-vertical OFETs [4]. The key point was that the small cross section of the channel in OFETs limited their current output.

High current output and low working voltage OFETs are highly desired for many applications such as active-matrix flat panel displays [11].

SUMMARY OF THE INVENTION

Figure 1A:
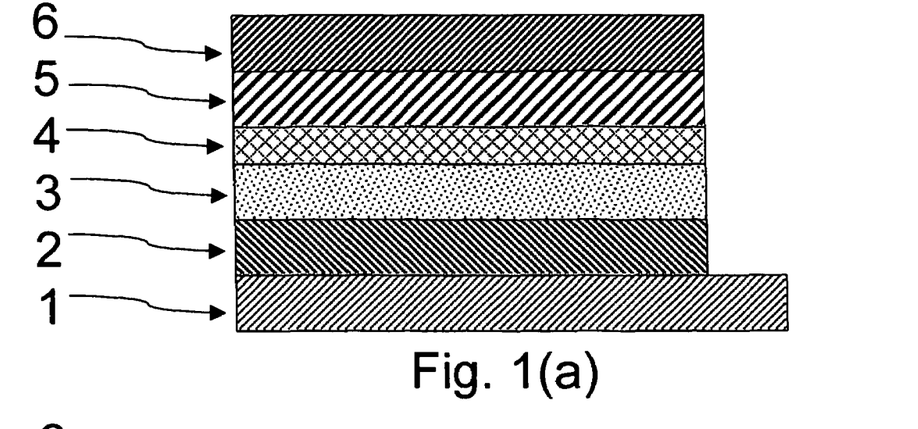
FIG. 1(a) depicts one embodiment of a semiconductor device structure for a Vertical Organic field effect Transistor (VOT) in accordance with the present invention. The layers 1-6 are identified as follows: 1 substrate, 2 gate electrode layer, 3 dielectric layer, 4 source electrode layer, 5 semiconductor layer, 6 drain electrode layer.

In accordance with the present invention, a novel organic field effect transistor is provided that utilizes new operating principles and device architecture as shown in FIG. 1a, in one particular embodiment. This device has an extremely short "channel" and an extremely large "channel" area cross-section. Moreover, the vertical structure includes an active cell that is composed of an organic layer sandwiched between the source and the drain electrodes. The active cell sits on top of a super capacitor [12] which is composed of a dielectric layer or an electrolyte layer sandwiched between the gate and source electrodes with the gate sitting below the source electrode. In current OFET's, the gate is placed between the source and drain electrodes.

The effect of the super capacitor is to induce charge at the interface of the source electrode and the active organic layer. The induction of charge at this interface is a result of not only the high capacitance but also the very thin (nanometer range—less than 200 nm) source electrode. The thin electrode provides a near-field effect that modifies the charge in the active organic layer. As a result of the gate placement, the thin source electrode and the super capacitor, the device shows extraordinary performance. The working voltage of the device is less than 5 volts while the output current is as high as 10 mA (4 A/cm$^2$). The output current is high enough to drive other organic devices, such as organic light-emitting diodes. Another advantage is that the on/off ratio is near $10^5$.

The above-described and many other features and attendant advantages of the present invention will become better understood by reference to the following detailed description when taken in conjunction with the accompanying drawings.

BRIEF DESCRIPTION OF THE DRAWINGS

FIG. 1 (b) depicts another embodiment of the present invention in which the semiconductor device structure is reversed from the structure shown in FIG. 1(a). The layers 1-6 are identified as follows: 1 substrate, 2 drain electrode layer, 3 semiconductor layer, 4 source electrode layer, 5 dielectric layer, 6 gate electrode layer.

FIGS. 2(a-1)-2(a-3) are schematic diagrams of the device operation mechanism. FIG. 2(a-1) depicts the Off-state where either there is no gate potential or less than a critical voltage has been applied to the gate. In this case the current should be very small controlled by the charge injection and transport in the active cell. Buffer layers may be added at the two interfaces, as in FIG. 1(c), to achieve very low current injection at no bias condition. FIG. 2(a-2) depicts the ON-state for hole transporting organic materials. With positive-gate potential, induced holes in the organic layer are responsible for the ON-state current, which can be controlled by the gate voltage. FIG. 2(a-3) depicts the ON-state for electron transporting organic materials. With negative-gate potential, induced electrons in the organic layer are responsible for the ON-state current, which can be controlled by the gate voltage.

FIG. 2(b1) is the band diagram without gate bias and FIG. 2(b2) is the band diagram with gate bias.

DETAILED DESCRIPTION OF THE INVENTION

In accordance with the present invention, device architecture is provided for a field effect transistor. The device is typically made using a vertical stack of films. The gate electrode can be placed at the bottom of the stack followed by a dielectric or electrolyte, followed by a source electrode, followed by an active semiconductor layer, followed by a drain electrode. The active semiconductor layer, electrodes, and the dielectric or electrolyte films can be made from organic, inorganic, or mixtures of organic/inorganic materials. The gate can be either above or below the source and drain. Moreover, there can be additional buffer films placed between the source and drain to modify the injection and transport properties of the holes and electrons in this device. Suitable modification of the film thickness and the materials results in a vertical stack that has an active cell on top of a super capacitor leading to a novel field effect transistor.

The Vertical Organic Transistor (VOT) that we demonstrate here is a field effect transistor that consists of a "capacitor" (dielectric layer sandwiched between the gate and the source electrodes) and the active cell (an organic layer sandwiched between the source and the drain electrodes) that are vertically interconnected as shown in FIG. 1(a). The bottom electrode acts as the gate electrode, the middle electrode acts as the source electrode, and the top electrode acts as the drain electrode. However, the structure of VOT can be inverted so that the gate electrode and the insulating layer is on the top of the source-drain which becomes the bottom half to the device in this alternate embodiment. See FIG. 1(b).

If the film constituting the source electrode is very thick, the device is simply a series connection of the capacitor and the active cell and will not work. When the thickness of the source electrode layer is below a critical value (depending on the screening effect of the source electrode layer, the material used and the roughness of the film), the device is no longer a simple series connection of a capacitor and an active cell. Field effect modification of the drain-source current becomes possible. The gate potential will modify the charge-injection and transport properties of the active cell, and control the current passing through drain and source electrodes.

Figure 1B:
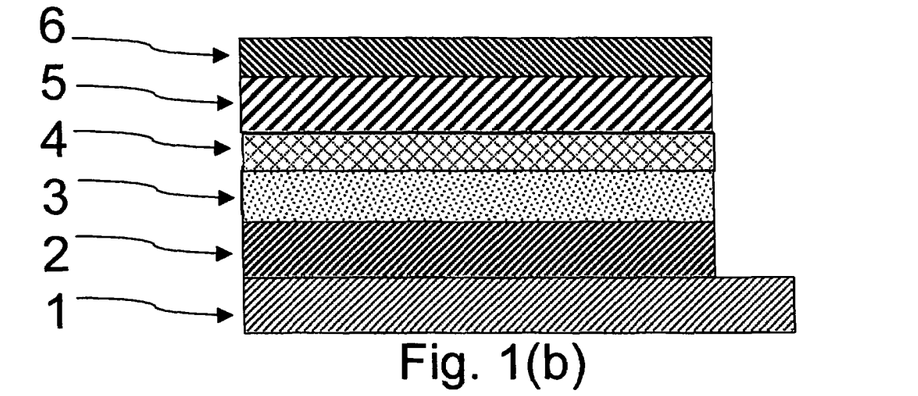
Figure 1C:
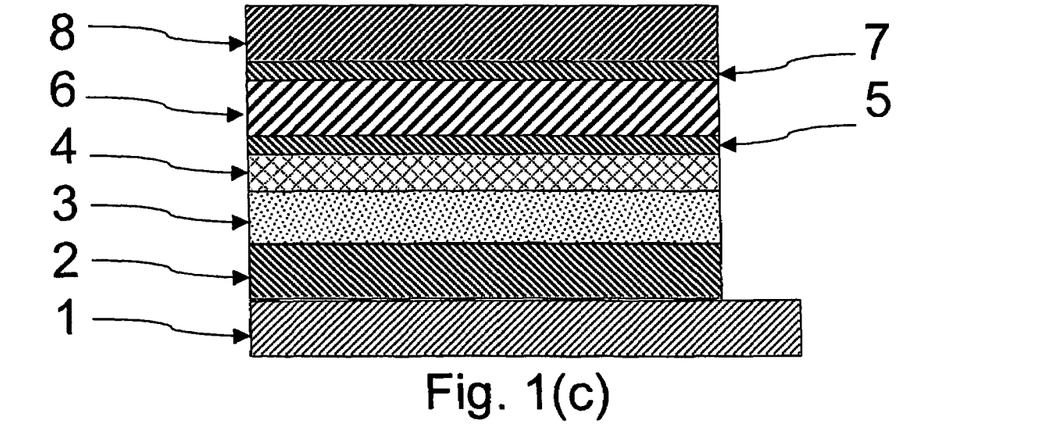
FIG. 1(c) depicts a semiconductor device structure of a vertical transistor in accordance with the present invention wherein the device includes buffer layers for charge injection modification. The layers 1-8 are identified as follows: 1 substrate, 2 gate electrode layer, 3 dielectric layer, 4 source electrode layer, 5 buffer layer, 6 semiconductor layer, 7 buffer layer, 8 drain electrode layer.

In another embodiment, the device can be made with modifying layers at the interface between the electrodes and the organic layer as shown in FIG. 1(c). These additional films control the injection and transport properties of the holes and electrons in this device.

The materials for the source, drain and gate electrodes can be a variety of metals, like copper, gold, aluminum, silver, platinum or multiple metal films, such as copper/aluminum. The electrodes may also be made from conducting polymers such as, 3,4-polyethylenedioxy-thiophenepolystyrene-sulfonate (PEDOT-PSS) and conducting inorganic (metal) oxides, like indium tin oxide (ITO). In addition, conducting nanoparticles or nanoparticles embedded in an organic or conducting matrix can also be used for the source electrode.

The materials for the dielectric layer can be a variety of dielectric or electrolytic materials from inorganic to organic, such as lithium fluoride and hydrated lithium fluoride. In particular, those materials with high-K values, like perovskites, such as $BaTiO_3$ or non-aqueous solid electrolytic polymer composites may be used.

The materials for the organic or semiconductor layer can be traditional organic field-effect-transistor materials, organic light-emitting diode materials, and other organic semiconductor materials. Exemplary materials include pentacene, fullerene derivatives ($C_x$) where x=60, 70, 80, 82, 84, etc., aluminum (III) 8-hydroxyquinoline ($Alq_3$), rubrene, N,N-diphenyl-N,N-bis(3-methylphenyl)-1,1-diphenyl-4,4 diamine (TPD), poly(p-phenylenevinylene) (PPV) derivatives, poly(N-vinylcarbazol) (PVK), polyfluorene (PF) derivative, poly(3,4-ethylenedioxythiophene)/poly(4-styrenesulfonate) (PEDOT-PSS), metal phthalocyanine (PC) complex (such as CuPc, ZnPc), 4,4',4"-Tris(N-3-methylphenyl-N-phenylamino)triphenylamine (m-TDATA), poly(3-hexyl thiophene) (P3HT), thiophene oligomers. Soluble fullerenes such as, [6,6]-phenyl C-61-butyric acid methyl ester (PCBM), and soluble pentacene. Moreover, the organic (semiconductor) layer can be partially or wholly replaced by traditional semiconductor materials like silicon, gallium arsenide, gallium phosphide, and gallium nitride.

The materials for the buffer layers can be hole or electron transporting materials (as used for OLED's) or dielectric materials, like LiF and metal oxides, that modify charge injection and transport properties. Nanoparticles can also be used to the same effect. The purpose of buffer layer on the source electrode is for increasing the charge injection barrier at zero gate potential and the buffer layer on the drain electrode side is for the purpose of preventing charge injection from the drain electrode in order to limit leakage current and provide a high On/Off ratio.

The substrate on which the semiconductor is formed can be any of the known electrically insulating substrates that are commonly used in electronic devices. The substrate can be flexible or rigid and can be made from either organic or inorganic materials. Glass is an exemplary substrate. Transparent anodes, like ITO, and transparent substrates, like glass, are required when the semiconductor is combined with an OLED. Flexible substrates are preferred when the semiconductor device is used in radio frequency identification (RFID) tag circuitry.

The semiconductor devices in accordance with the present invention can be fabricated by simple vacuum thermal evaporation methods, sputtering, molecular beam epitaxy, spin-coating or continuous-coating techniques like gravure, flexography, lithography, ink-jet, silkscreen, thermal, and other printing technologies and combinations of technologies, printing or otherwise. The data shown in this specification are for devices fabricated by vacuum thermal evaporation methods. A preferred process includes depositing all films, for device fabrication, without breaking vacuum.

Figure 2:
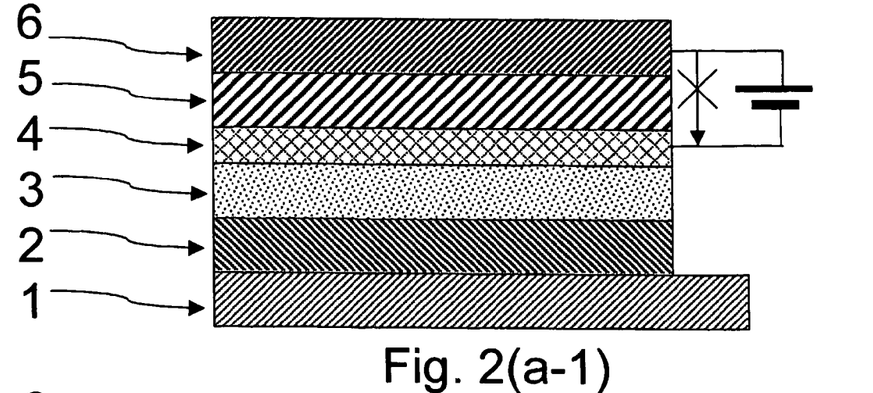
FIG. 2(b) represents the schematic band diagram for device operation when charge injection from the source electrode plays an important role.
Figure 2B:
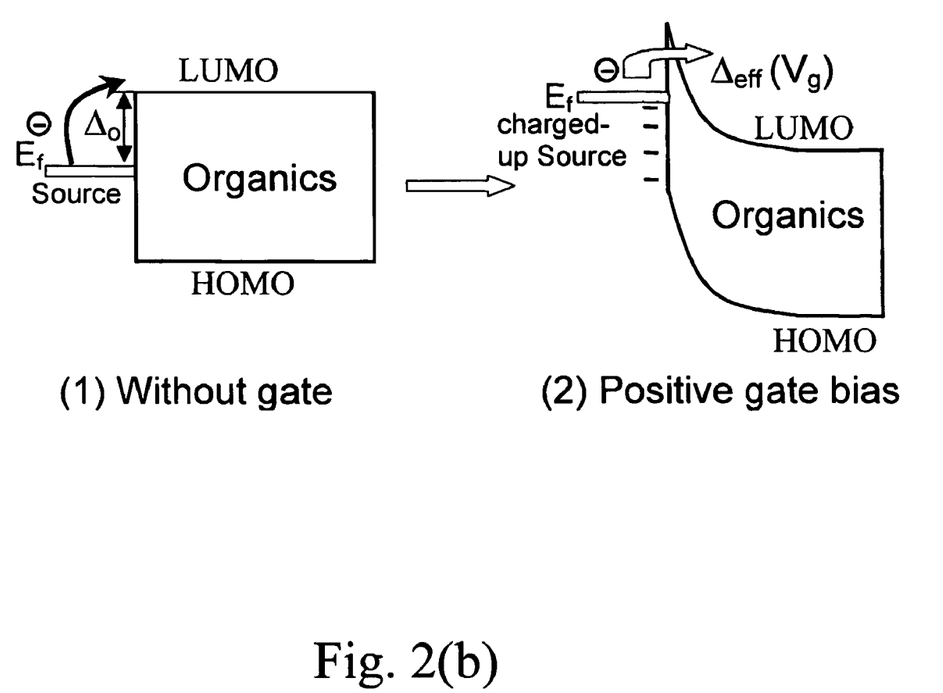

For the convenience of device operation and description herein, the potential of the source electrode is wired to ground. The applied gate voltage leads to charge storage at both electrodes. When the source-electrode layer is thin enough—or consists of nanoparticles or conducting polymers with a large Debye screening length—the stored charge will not be shielded completely and will influence the organic layer. First, the stored charge in the source electrode induces charge carriers within the organic semiconductor layer. For hole-transporting organic materials, a positive gate voltage is needed to induce negative charges within the source electrode and holes within organic layer as the case shown in FIG. 2(a-2). The induced holes will contribute to the drain-source current. For electron-transporting organic materials, a negative potential should be applied to the gate electrode to have positive charges stored within the source electrode. These charges will induce electrons within the organic layer as the case shown in FIG. 2(a-3). The induced electrons will contribute the drain-source current. Second, the stored charge in the source electrode layer also modifies the charge injection at the source/organic interface causing a field-effect modification of drain-source current. Therefore, the drain-source current is controlled by the gate potential in the VOT.

When charge injection from the source electrode into the semiconductor layer plays an important role in determining the magnitude of the source-drain current, the mechanism of the device may operate in the following fashion. In order to understand this mechanism, conceive of the device structured as follows. An n-type organic semiconductor is used for the active cell. The source electrode is used as a common cathode for both the capacitor cell and the active cell. Consequently, the current injection for the active cell is controlled by electron injection from the source electrode. Moreover, materials with mismatched energy levels between the organic semiconductor and the source electrode at zero gate-bias condition are selected in order to achieve low leakage current. A possible device mechanism is herein described. Before applying a gate bias (FIG. 2(b1)), the large injection barrier height ($\Delta_o$) (due to rectified contact formation) prevents electron injection efficiently from the source electrode into the semiconductor layer. When the gate is positively biased (FIG. 2(b2)), the capacitor cell is charged up. Negative charge is then built-up within the source electrode layer with an exponentially-decreasing distribution profile having a maximum at the dielectric/source interface and decreasing toward the source/organic interface. Because of the super-high capacitance of the capacitor cell, the very thin and rough source layer and the possibility of partial oxidization of the source electrode, there is certain amount of negative charge on the top surface of the source electrode of our device. The electric field produced by the charged capacitor cell cannot completely vanish at the source/organic interface due to the rough interface and net charges at the surface, which also induces positive charge in the organic layer, near the source/organic interface. As a result, the electron injection barrier height from the source into the organic layer is lowered by an amount ($\delta$). Hence, the effective energy barrier height ($\Delta_{eff}$) for electron injection from the source electrode is decreased ($\Delta_{eff}=\Delta_o-\delta$), allowing efficient electron injection from the source into the semiconductor layer causing an increase of the source-drain current ($I_{sd}$) when a drain bias is applied. At a constant drain-source bias ($V_{ds}$) and temperature (T), the gate potential ($V_g$) controls the source-drain current.

Examples of practice are as follows:

A number of semiconductor devices in accordance with the present invention were prepared using various organic materials as the semiconductor layer to provide devices that had low working voltage, high output current and high ON/OFF ratios.

Figure 3:
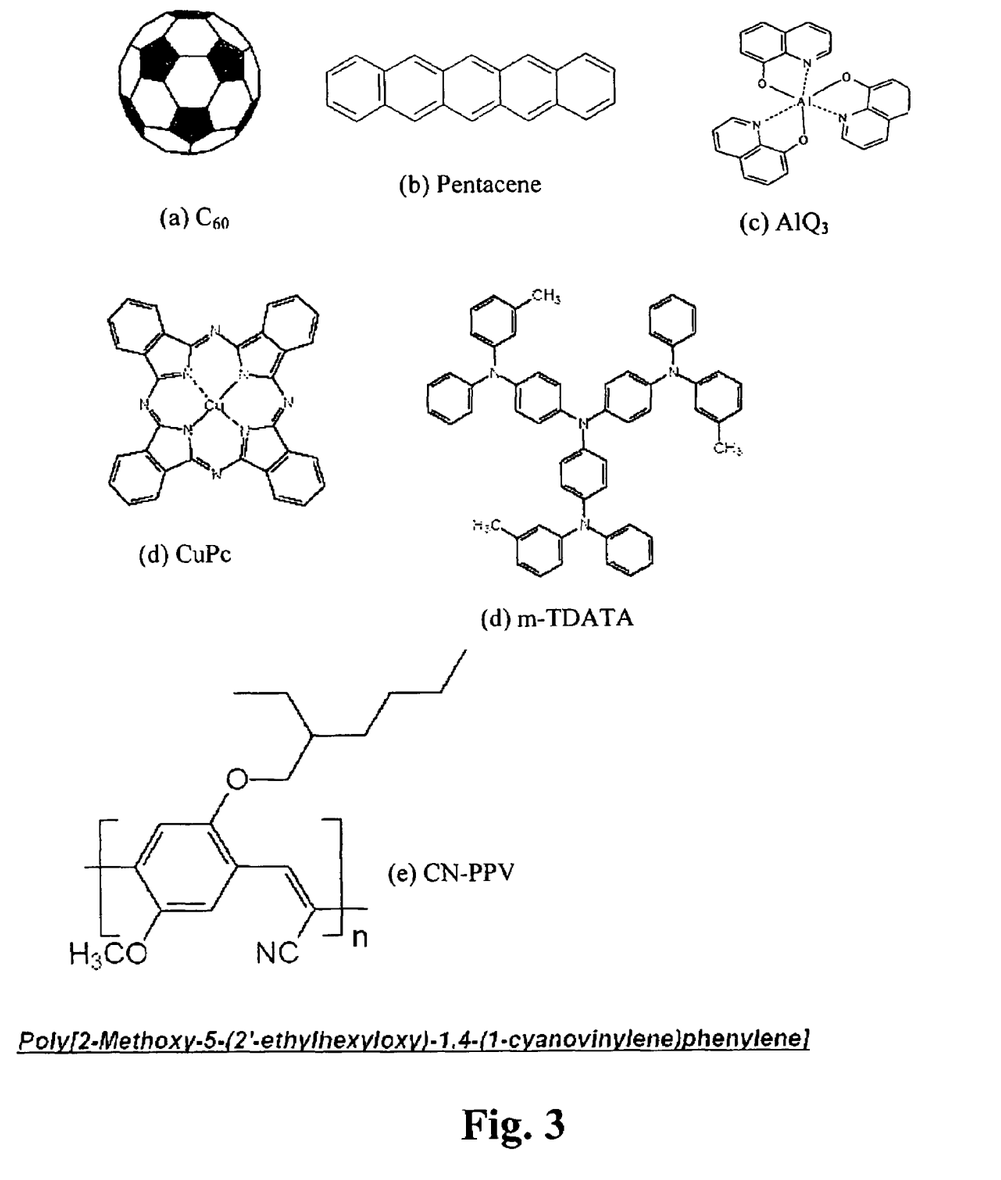
FIG. 3 shows the chemical structure of some exemplary organic materials used for the semiconductor or organic layer during VOT fabrication.

Vertical organic field effect transistors were fabricated where copper (Cu) was used for the gate and source electrode, and aluminum (Al) was used for the source and drain electrodes. $C_{60}$, pentacene, and aluminum tris(8-hydroxyquinoline) ($AlQ_3$) were used for the organic layers and lithium fluoride (LiF) was used for the dielectric layer. The area of the fabricated device was 0.25 mm². The molecular structures of the organic (semiconductor) layer materials are illustrated in FIG. 3.

Figure 4A:
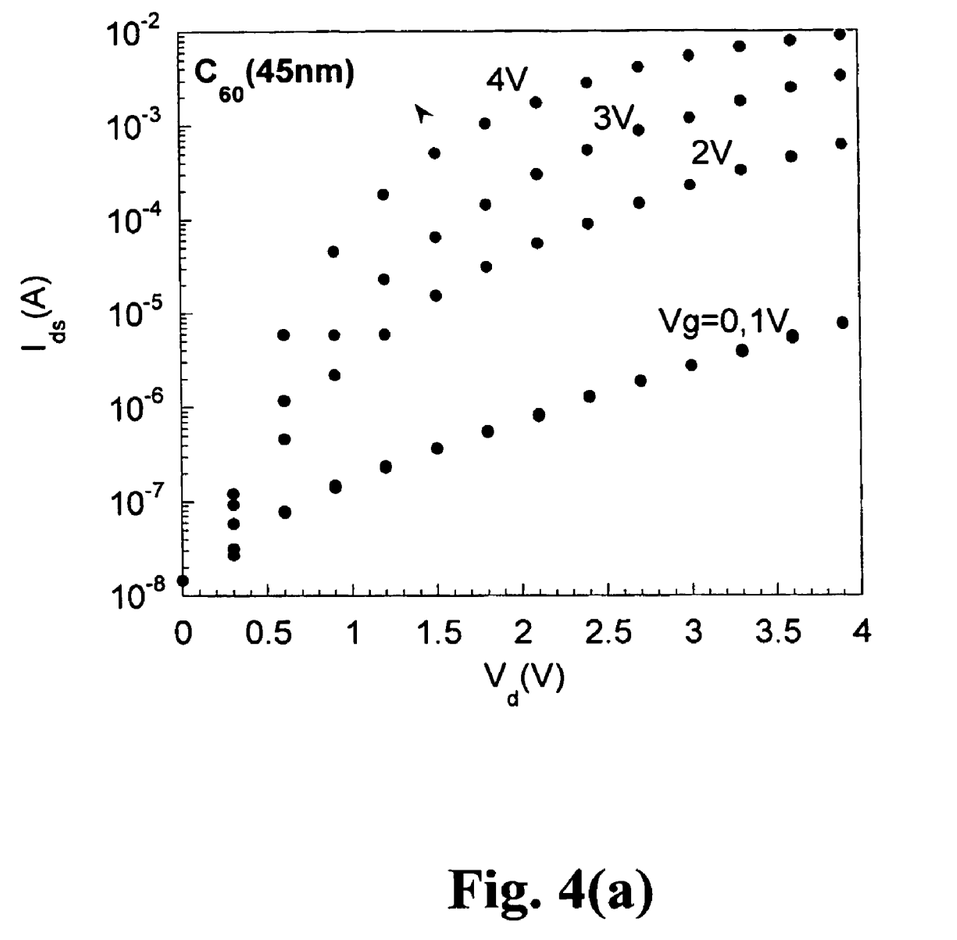
FIG. 4(a) is a graph showing typical drain-source I-V characteristics at various gate potentials for a 45 nm thick $C_{60}$ layer used as the active organic layer. The result is plotted on a semi-log scale.
Figure 4B:
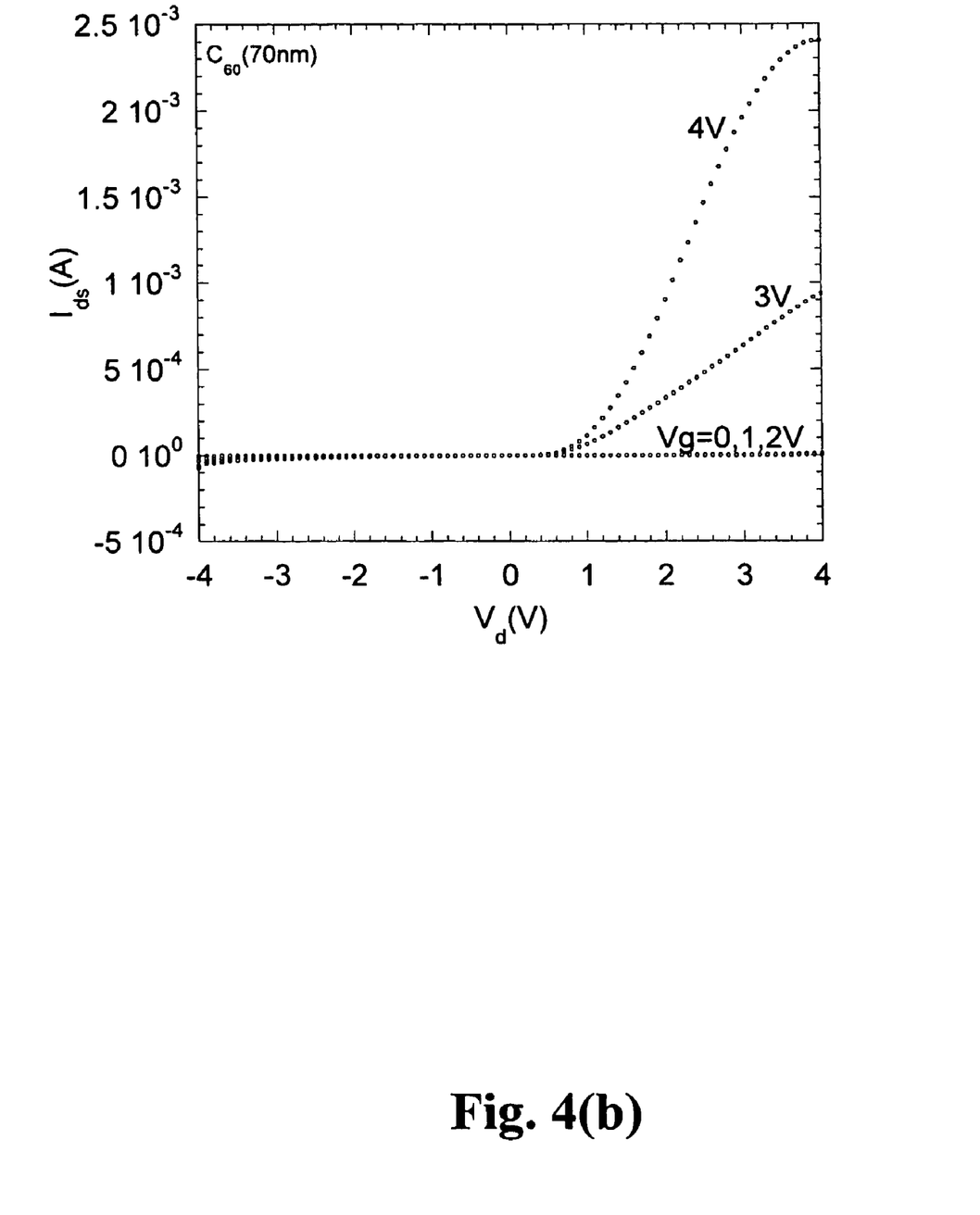
FIG. 4(b) is a graph showing typical drain-source I-V characteristics at various gate potentials for a 70 nm thick $C_{60}$ layer used as the active organic layer. The result is plotted on a linear scale.

From our initial results, $C_{60}$ is the best material for the semiconductor layer in the VOT. This embodiment of the device shows a low working voltage (less than 5V), a high current output (10 mA or 4 A/cm²), and a high ON/OFF ratio (approximately $10^5$). FIG. 4 shows a typical drain-source current at various gate potentials.

Figure 5:
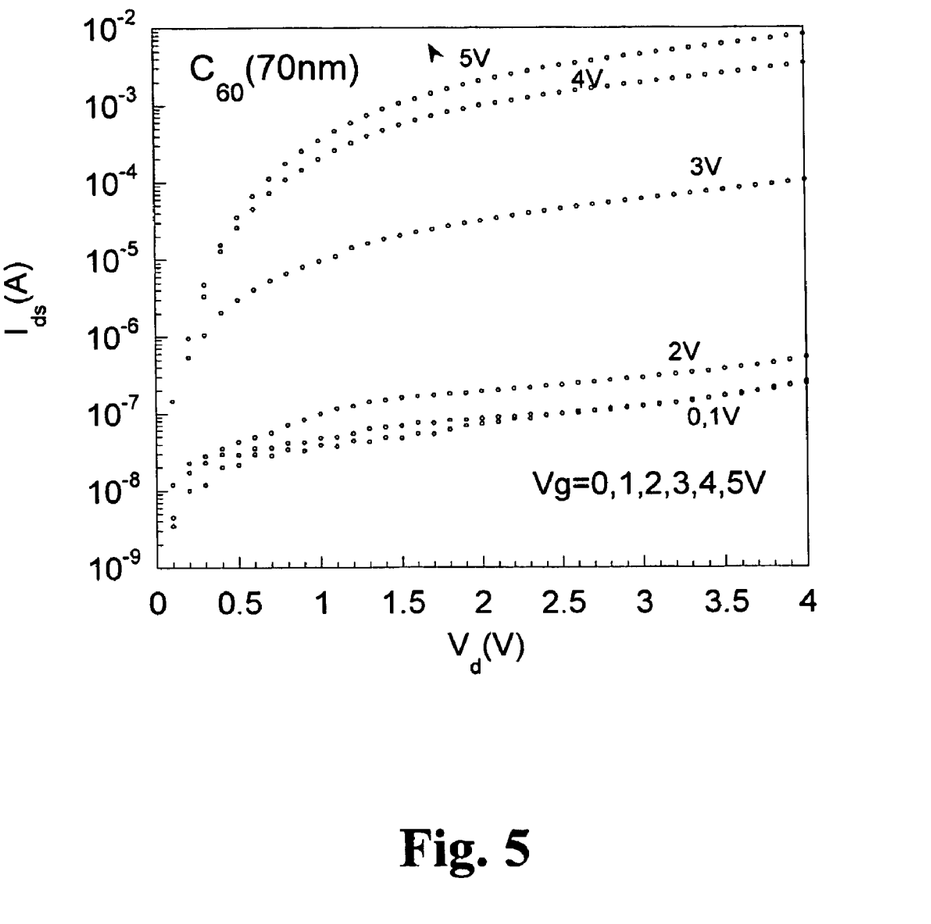
FIG. 5 is a graph showing drain-source I-V characteristics at various gate potentials for an exemplary VOT in accordance with the present invention where $C_{60}$ is used as the organic layer. The ON/OFF ratio at 4V gate bias and 5V drain voltage is near $10^5$.

As shown in FIG. 5, for the device specified in the paragraph above, the highest ON/OFF ratio obtained is near $10^5$. By fine-tuning the materials, by purification of the materials, and by adjustments to the fabrication process higher ON/OFF ratios will be obtained.

Figure 6A:
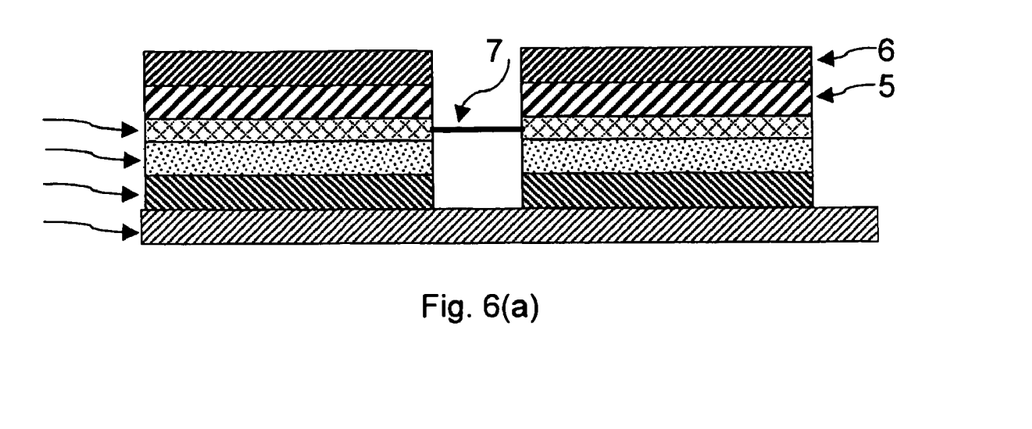
FIG. 6(a) is a schematic diagram of a simple series connection of a super capacitor cell and an active cell to mimic the case when the source electrode layer is too thick. The layers 1-7 are identified as follows: 1 substrate, 2 gate electrode layer, 3 dielectric layer, 4 source electrode layer, 5 semiconductor layer, 6 drain electrode layer, 7 metal wire.
Figure 6B:
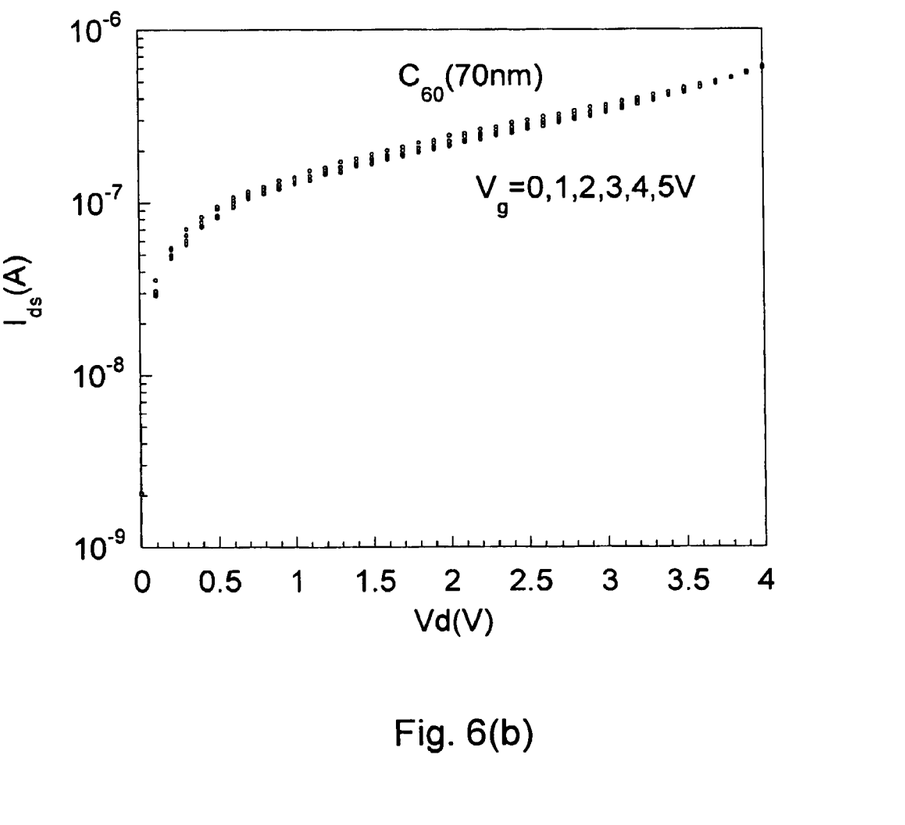
FIG. 6(b) is a graph showing drain-source I-V characteristics at various gate potentials for the simple series connection shown in FIG. 6(a). No current modification by the gate potential is seen.

When we use a wire to connect the "capacitor cell" from our device with the active cell (see FIG. 6(a)), the simple series connected device shows no field-modified drain-source current as shown in FIG. 6(b). This experiment supports the idea that observed characteristics shown in FIGS. 4 and 5 are true nanometer-scale phenomenon.

Figure 7:
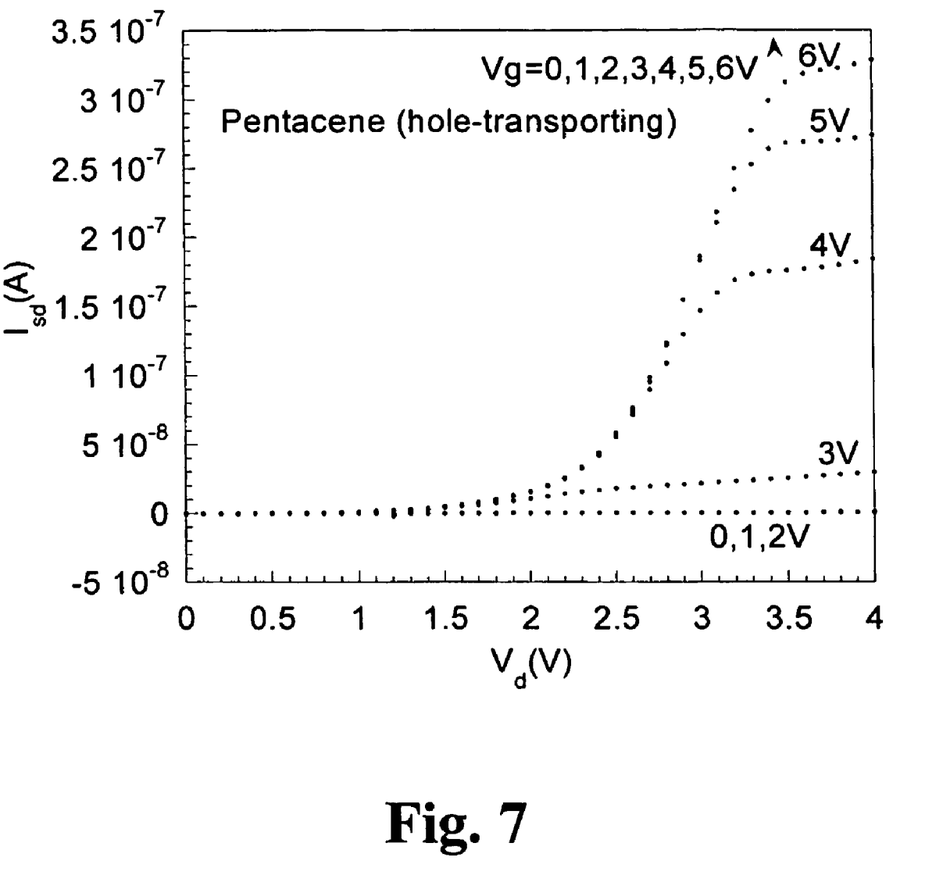
FIG. 7 is a graph of the drain voltage ($V_d$) dependent source-drain current ($I_{sd}$) with data at gate voltages ranging from 0 to 6 V. When the hole transporting material pentacene is used for the organic layer, only positive gate bias enhances the source-drain current.

When we used pentacene for the organic (semiconductor) layer, the current output is small (see FIG. 7). The drain voltage ($V_d$) dependent source-drain current ($I_{ds}$) characteristics at various gate voltages is shown in FIG. 7. When gate voltage is less than 3 V, the drain-source current is very low when the drain bias is scanned from 0 to 4 V. When the gate voltage is above 2 V (3,4,5,6V), the source-drain current begins to increase, and current saturation is observed as shown in FIG. 7. The current is about 300 nA. By fine-tuning materials and fabrication techniques, high current output VOT based on pentacene are expected.

Figure 8:
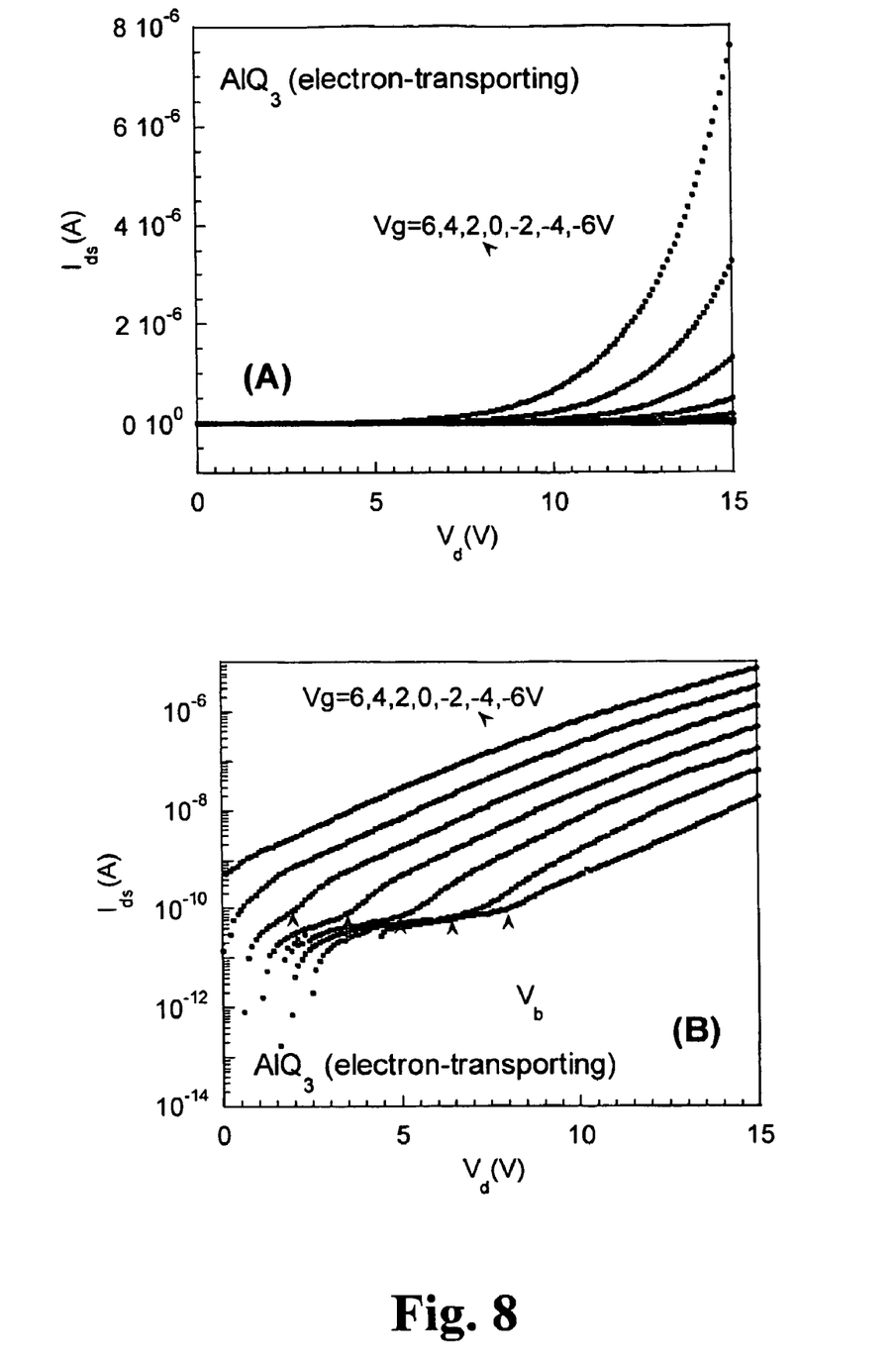
FIGS. 8(a) and 8(b) are graphs of drain-source I-V characteristics at various gate potentials for an exemplary VOT, in accordance with the present invention, where the electron-transporting material $AlQ_3$ is used as the organic (semiconductor) layer. The drain-source current only increases at negative gate potential.

We also used the electron transporting organic material $AlQ_3$ for the organic layer during device fabrication. Only a negative gate potential can increased the drain-source current as shown in FIG. 8. We failed to observe current saturation for this case. Higher drain voltage than that indicated in FIG. 8 causes device break-down.

A built-in potential ($V_b$) seems to exists in this system as shown in FIG. 8(b). The built-in potential indicates a critical drain-bias for the current injection. One can see that with positive potential applied to the gate electrode, the built-in potential shifts towards higher voltage. When negative potential is applied to the device, the built-in potential shifts toward a lower voltage and increases the drain-source current. This is additional proof that the device is charge injection controlled. Also, the induced electrons within the $AlQ_3$ layer contribute the increased current.

Figure 9:
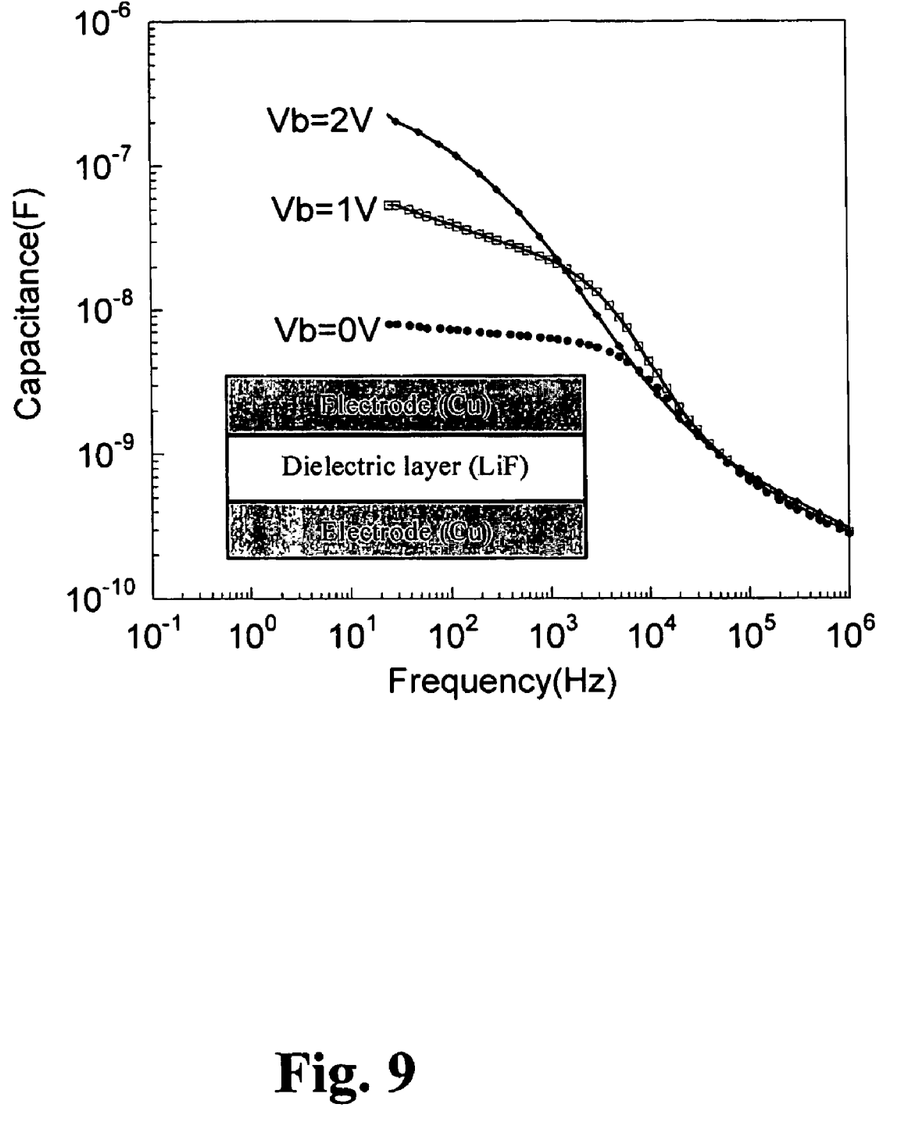
FIG. 9 is a graph showing the frequency dependence of the device's capacitance with DC bias at 0, 1, and 2 volts, respectively. The insert shows the capacitors' structure, indicating the super capacitor characteristics of the bottom capacitor cell.

The following example provides a demonstration of the formation of a super capacitor (25 µF/cm² @ 20 Hz) for use in accordance with the present invention. Capacitors can store charge. The higher capacitance, the more charges will be stored. A key point in the formation of our high-performance vertical organic transistors is that we built into our device a super high capacitor. The device structure is the same as a regular capacitor as shown in the insert of FIG. 9. We use vacuum thermal evaporation methods for capacitor fabrication without breaking chamber vacuum. A clean interface between metal electrodes and dielectric layer will cause the formation of colossal capacitors [12]. The typical frequency dependence of the capacitance of the device at various bias conditions is shown in FIG. 9. It can been seen that at 20 Hz frequency, with 2 volt DV bias applied to the device, the device's capacitance is about 250 nF, the corresponding capacitance area density is about 25 µF/cm². This use of super capacitors can also be applied to traditional transistors, resulting in a tremendous increase in device performance.

Some of the distinct advantages of VOT's in accordance with the present invention are their low working voltage, high current output (sufficient to drive OLEDs), and simplicity of manufacture, in particular with regards to incorporating them along with other organic electronic devices, such as organic light emitting diodes.

The display industry is pursuing technology for the commercialization of thinner, lower power, and higher performance displays, in part through the application of OLEDs as the light emissive elements. Initial offerings by manufactures in this area have been passive-matrix OLED display modules. These displays have a variety of drawbacks. They are typically low in resolution, slow speed, and tend to consume more power than alternatives, as manufactures push to larger display sizes.

Figure 10:
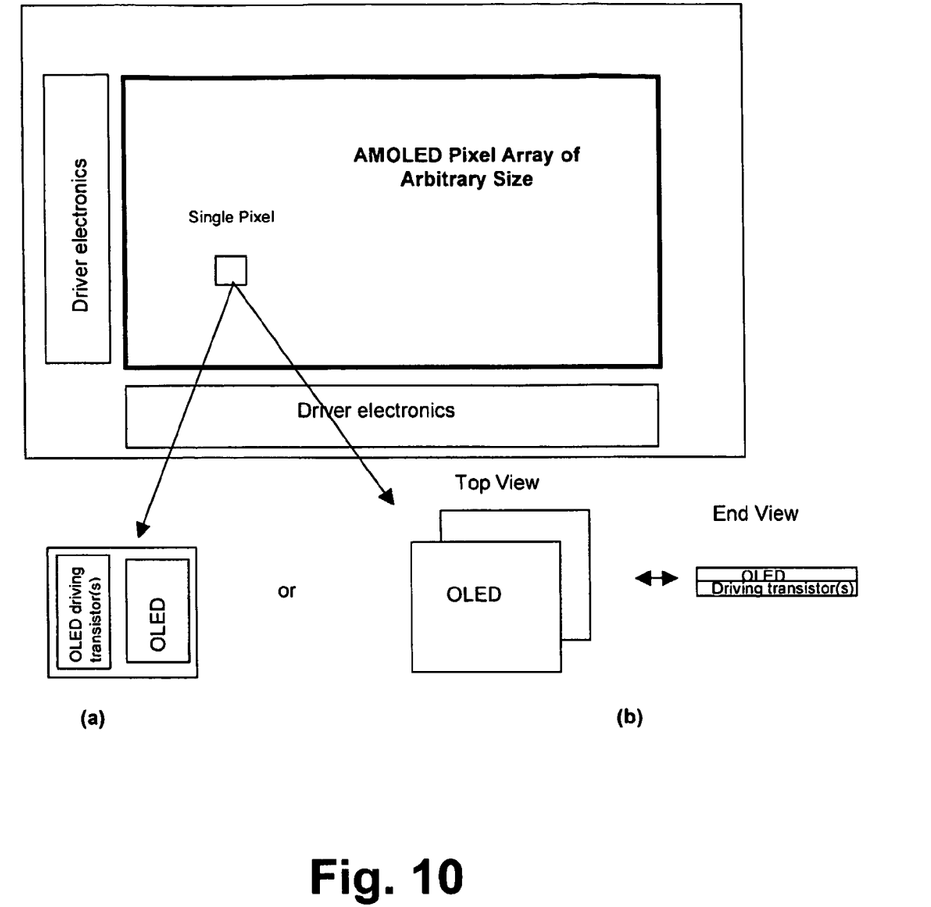
FIG. 10 is a schematic diagram of an active matrix organic light emitting diode (AMOLED) display. The AMOLED panel is shown along with the driver circuitry. A single pixel is shown in two possible embodiments: (a) with the OLED and pixel transistors side by side in the pixel and (b) with the OLED on top of the pixel transistors in both a top and end view.

A solution to the disadvantages of passive-matrix OLED displays, as cited above, is the use of an active-matrix OLED display technology. The VOT in accordance with the present invention is uniquely suited to such an application due to its low working voltage, high current output, and ease of integration with OLED manufacturing processes. A particular embodiment of an active-matrix OLED display is illustrated in FIG. 10. It consists, in part, of an emissive front panel consisting of OLED pixels and a back-plane consisting of VOT's in pixels acting as driving transistors for the OLEDs. Each pixel has at least one VOT and can have as many as six or more per pixel depending driving method used in order to achieve the image quality desired. A variety of pixel configurations are possible with two shown in FIG. 10. One embodiment has the OLED in a side-by-side arrangement with the pixel driving transistors and the other shows the OLED on top of the pixel transistors in order to maximize the aperture ratio.

An additional advantage provided by the device architecture and materials of the VOT is the ability to make the semiconductor layer specified in FIGS. 1(a-c) with either p-type or n-type materials. The ability to fabricate the VOT as either a p-type or n-type transistor, or complementary transistors, has significant application in the manufacture of logic circuitry for application like RFID tag circuitry. It has long been understood that complementary transistors (manufactured by traditional silicon CMOS technology) have significant advantages in logic circuits like low power dissipation, short propagation delays, controllable rise and fall times and noise immunity. These advantages will be applicable to organic electronic circuitry as well.

Advantages provided by semiconductor devices that have the device architecture and materials in accordance with the present invention include low working voltages and high current output (at least sufficient to drive an OLED). The semiconductor devices may be used in a wide range of electronic devices including, but not limited to, personal computers, cell phones, televisions, general wide area lighting, signs, billboards, communications and any of a number of information appliances.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited by the above preferred embodiments, but is only limited by the following claims.

BIBLIOGRAPHY

1. F. Ebisawa, T. Kurokawa, and S. Nara, J. Appl. Phys. 54, 3255(1983).
2. A. Tsumura, H. Koezuka, and T. Ando, Appl. Phys. Lett. 49, 1210(1986).
3. G. Horowitz, Adv. Mater. 10, 365(1998).
4. C. D. Dimitrakopoulos and P. R. L. Malenfant, Adv. Mater. 14, 99(2002).
5. G. Wang, Y. Luo, and P. H. Beton, Appl. Phys. Lett. 83, 3108(2003).
6. C. D. Dimitrakopoulos, S. Purushothaman, J. Kymissis, A. Callegari, and J. M. Shaw, Science, 283, 822(1999).
7. N. Stutzmann, R. F. Friend, H. Sirringhaus, Science, 299, 1881(2003).
8. R. Parashkov, E. Becker, S. Hartmann, G. Ginev, D. Schneider, H. Krautwald, T. Dobbertin, D. Metzdorf, F. Brunetti, Schildknecht, A. Kammoun, M. Brandes, T. Riedi, H. Johannes, and W. Kowalsky, Appi. Phys. Lett. 82, 4579(2003).
9. P. Ostoja, S. Guerri, S. Rossini, M. Servidori, C. Taliani, R. Zamboni, Synth. Met. 54, 447(1993).
10. A. Dodabalapur, L. Torsi, H. E. Katz, Science 268, 270 (1995).
11. A. Dodabalapur, Z. Bao, A. Makhija, J. G. Laquindanum, V. R. Raju, Y. Feng, H. E. Katz, and J. Rogers, Appl. Phys. Lett. 73, 142(1998).
12. Conway, B. E. Electrochemical supercapacitor: New York: Plenum Press, c1999. Conway B E, J. Electrochemical Society 138, (1539) 1991. An K H, Kim W S, Park Y S, Moon J M, Bae D J, Lim S C, Lee Y S, Lee Y H, Adv. Functional Mater. 11, (387) 2001. P. Lunkenheimer, V. Bobnar, A. V. Pronin, A. I. Ritus, A. A. Volkov, and A. Loidl, Phys. Rev. B 66, 52105(2002).

What is claimed is:

1. A semiconductor device comprising:
a drain electrode comprising an exterior surface and an interior surface;
a gate electrode comprising an exterior surface and an interior surface;
a source electrode comprising a first surface and a second surface that define the thickness of said source electrode;
a semiconductor layer that is located between said drain electrode and said source electrode wherein said semiconductor layer is in electrical contact with said interior surface of said drain electrode and said first surface of said source electrode; and
a dielectric layer that is located between said gate electrode and said source electrode wherein said dielectric layer is in electrical contact with said interior surface of said gate electrode and said second surface of said source electrode and wherein the thickness of said source electrode is sufficiently small to provide for control of electrical current between said source and drain electrode by controlling the electrical potential that is applied to said gate electrode, and
wherein said drain electrode consists essentially of aluminum, said gate electrode consists essentially of copper, said first surface of said source electrode consists essentially of aluminum and said second surface of said source electrode consists essentially of copper.

2. A semiconductor device according to claim 1, wherein the thickness of said source electrode is less than 200 nanometers.

3. A semiconductor device according to claim 1, that additionally includes a substrate layer located adjacent to said exterior surface of said gate electrode wherein said substrate layer comprises an electrically insulating material.

4. A semiconductor device according to claim 1, that additionally includes a substrate layer located adjacent to said exterior surface of said drain electrode wherein said substrate layer comprises an electrically insulating material.

5. A semiconductor device according to claim 1, wherein said dielectric layer comprises one or more dielectric materials selected from the group consisting of ionic compounds, high-k dielectric materials, electrolyte materials, perovskite-structured materials and polymer high-k materials.

6. A semiconductor device according to claim 1, wherein said semiconductor layer comprises a material selected from the group consisting of organic field-effect-transistor material, organic light-emitting diode material, organic semiconductor material and inorganic semiconductor material.

7. A semiconductor device according to claim 1 wherein said semiconductor layer consists essentially of a material selected from the group consisting of pentacene, $C_{60}$ and aluminum (111) 8-hydroxyquinoline.

8. A semiconductor device according to claim 7 wherein said dielectric layer consists essentially of lithium fluoride.

* * * * *